United States Patent [19]
Tait

[11] Patent Number: 5,657,012
[45] Date of Patent: Aug. 12, 1997

[54] FINGER OPERABLE CONTROL DEVICE

[76] Inventor: David Adams Gilmour Tait, 34 Mount Street, Dorking, Surrey RH4 3HX, Great Britain

[21] Appl. No.: 778,160

[22] PCT Filed: Jun. 21, 1990

[86] PCT No.: PCT/GB90/00959

§ 371 Date: Dec. 20, 1991

§ 102(e) Date: Dec. 20, 1991

[87] PCT Pub. No.: WO90/16045

PCT Pub. Date: Dec. 27, 1990

[30] Foreign Application Priority Data

Jun. 21, 1989 [GB] United Kingdom .................... 8914235

[51] Int. Cl.$^6$ .................................................. G08C 21/00
[52] U.S. Cl. .................... 341/20; 341/33; 324/686
[58] Field of Search ............... 341/20, 33; 340/709, 340/710; 324/659, 672, 686; 361/278, 280, 288, 328, 330, 283, 283.3; 307/113; 345/173

[56] References Cited

U.S. PATENT DOCUMENTS

| 4,016,490 | 4/1977 | Weckenmann et al. ............ 341/33 |
| 4,168,464 | 9/1979 | Coulson et al. . |
| 4,264,903 | 4/1981 | Bigelow . |
| 4,305,007 | 12/1981 | Hughes . |
| 4,755,634 | 7/1988 | Pepper, Jr. . |
| 4,873,400 | 10/1989 | Rapp et al. ............ 341/33 |

FOREIGN PATENT DOCUMENTS

| 0250931 | 1/1988 | European Pat. Off. . |
| 1110611 | 4/1968 | United Kingdom . |
| 159034 | 5/1981 | United Kingdom . |
| 2205164 | 11/1988 | United Kingdom . |

Primary Examiner—Brent Swarthout
Assistant Examiner—A. M. Hill

[57] ABSTRACT

A finger operable control device that includes a sensor having five conductive plates. The conductive plates are coupled to a detector circuit arranged to sense capacity imbalance due to the presence of a finger or an earthed object on or by one or more of the conductive plates. The device is utilized as a mouse or joystick.

15 Claims, 9 Drawing Sheets

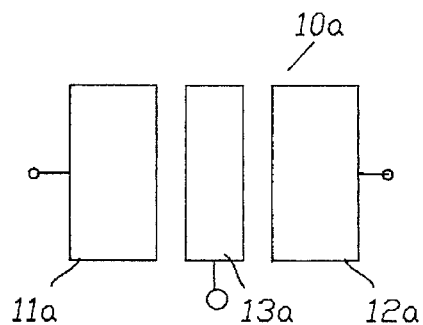
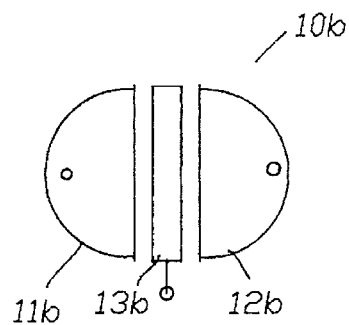
Fig.1A.
Fig.1B.
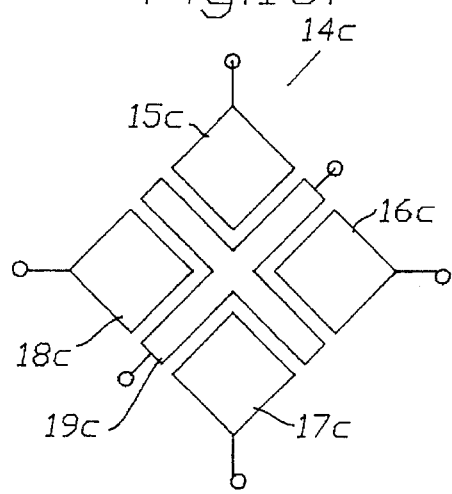
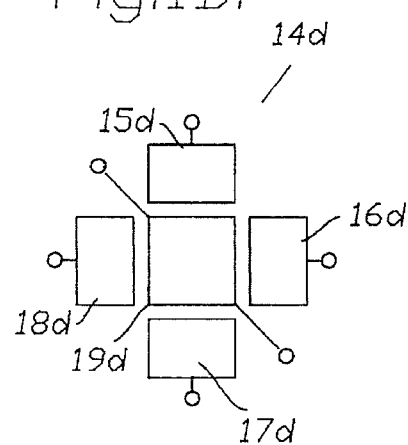
Fig.1C.
Fig.1D.
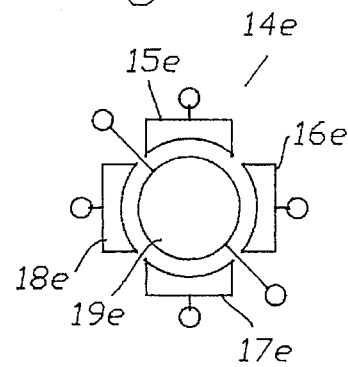
Fig.1E.

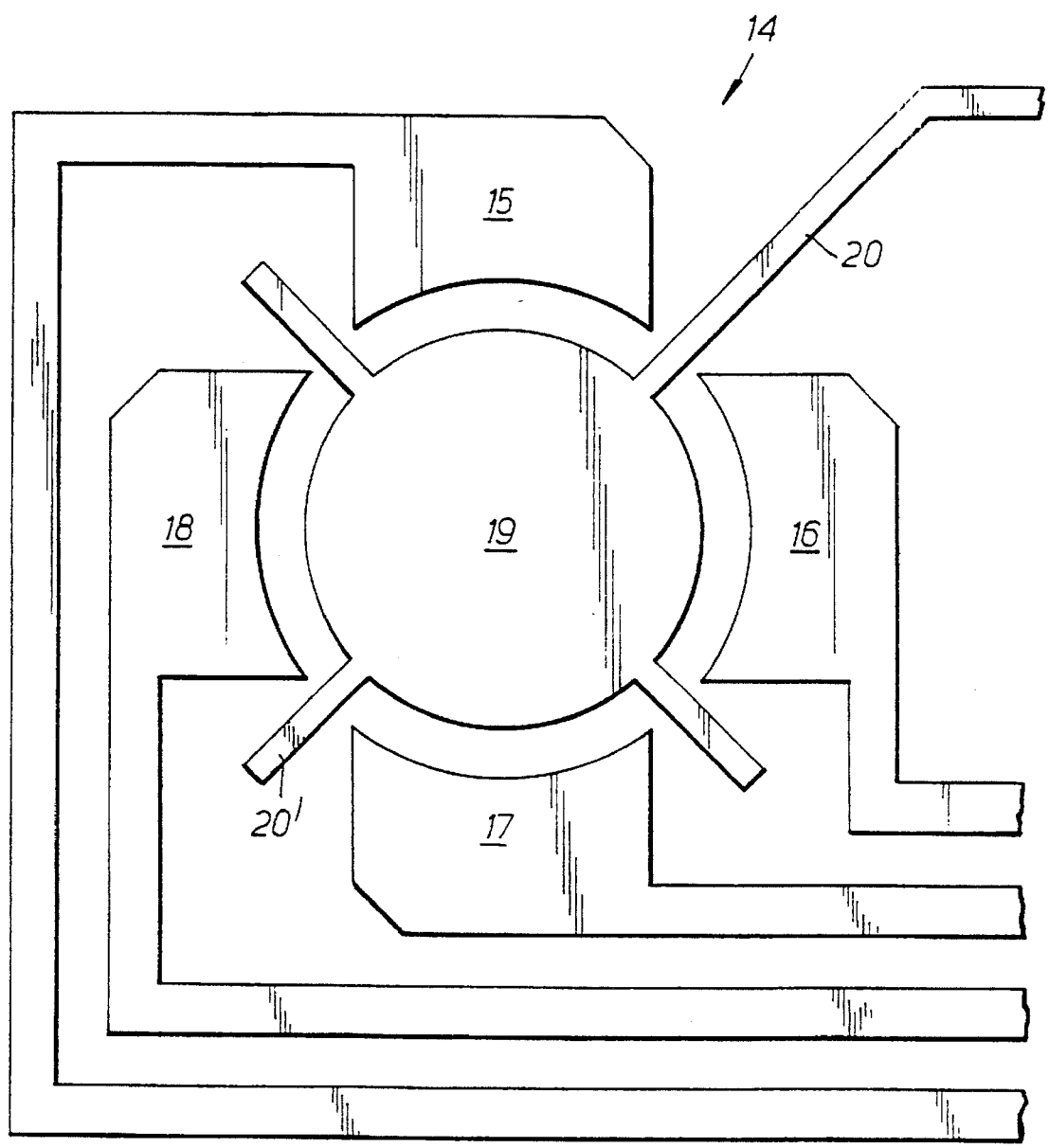

FINGER OPERABLE CONTROL DEVICE

FIELD OF THE INVENTION

The present invention relates to finger-operable control devices for controlling equipment such as computers or position-controlled devices and the like.

BACKGROUND INFORMATION

Control devices such as mouse, trackball, or joystick are used to control such equipment but all these have moving parts and in the case of a mouse a level table surface is needed. Joysticks and trackballs are bulky and require robust mounts and all are protrusive. Touch-plate switches are known, but these are simple on/off devices.

SUMMARY OF THE INVENTION

It is an object of the present invention to provide a finger-operable control device having at least some of the following characteristics, that is a device which:
a) is compact,
b) has no moving parts,
c) can be conveniently mounted on an instrument panel,
d) can be operated on an uneven surface,
e) can be sealed against dust, moisture or liquid,
f) is not affected by vibration,
g) has a control response which is extremely fast and not subject to substantial lag between operation by the operator and response by the instrument.

According to the present invention a finger operable control device (such as a joystick emulator or mouse) comprises a sensor having a central electrically conductive plate, a first pair of electrically conductive plates on a first axis and spaced from opposite edges of the central plate to form a first pair of capacitors therewith having substantially equal capacitance, a second pair of electrically conductive plates on a second axis different from the first and spaced from opposite edges of the central plate to form a second pair of capacitors therewith having substantially equal capacitance and is characterised in that at least one of the plates is connected to a detector circuit arranged to sense capacity imbalance between at least the first pair of capacitors induced by the presence of a finger or finger operable earthed object placed on or near the conductive plates when the finger or object is disposed asymmetrically along the first axis with respect to the central plate.

The plates may be formed as a matrix of copper conductors on a printed circuit board. In some embodiments of the invention one or more of said conductive plates may be driven by alternating signals, and in others, the plates are connected to phase-sensitive detectors.

The amount of signal detected is normally small, being due to stray capacity between conductors of the matrix which is balanced by design to give a very low zero residual signal. The presence of a grounded object such as the operator's fingertip intercepts some of the electrical flux and unbalances the stray signals. The phase and amplitude of the imbalance depends on the precise position of the fingertip, i.e., whether it is to the left or right of the axis of symmetry of the matrix, or above or below the centre-line. Sensitivity to angular direction and distance of finger movement is determined by the design of the matrix.

The detector output is passed to logic circuits which convert the output into a form suitable for transmission to a computer or other indicating device so as to control for example the position of a cursor on a display screen by slightly varying the position of the operator's finger located on the sensitive area of the device.

BRIEF DESCRIPTION OF THE DRAWINGS

Embodiments of the invention will now be described by way of example with reference to the accompanying drawings, in which;

FIGS. 1A–F show five embodiments of a sensor matrix,

In the drawings, like parts are given like references.

DESCRIPTION OF PREFERRED EMBODIMENT

Figure 2A:
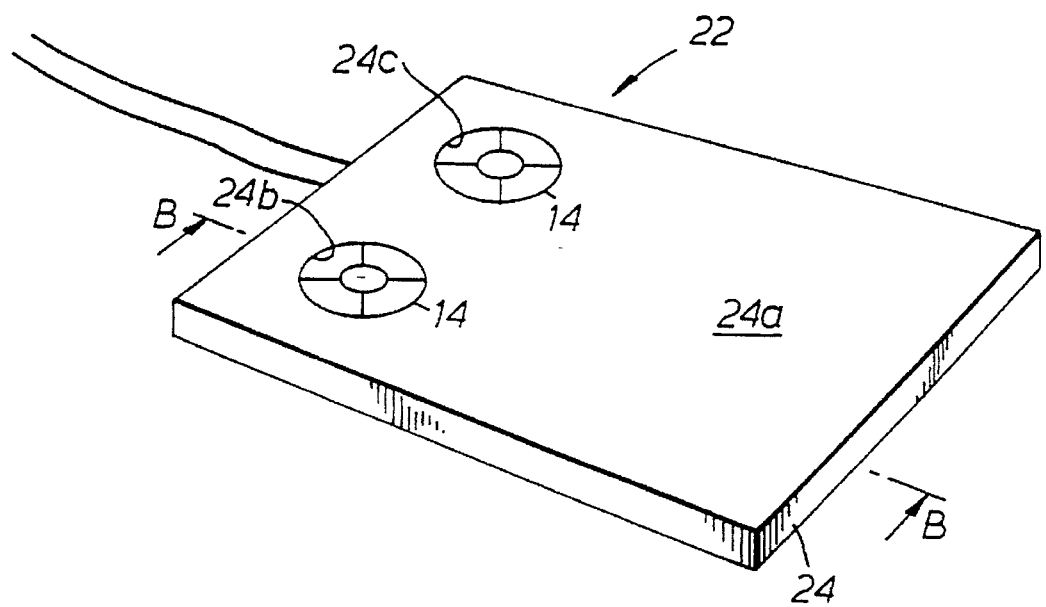
FIGS. 2A–C show a perspective, a cross-section on line B—B of FIG. 1A and a side view of a device according to the invention, FIGS. 2D and E show a side cross-section and an elevation of a device similar to that of FIGS. 2A–C according to the invention.

FIGS. 1A to 1E show a number of possible configurations of a sensor according to the invention, where FIG. 1A and FIG. 1B depict single-axis sensors $10a/10b$ comprising two conductive plates $11a/11b$, $12a/12b$ arranged symmetrically about a central plate $13a/13b$. FIGS. 1C, 1D and 1E depict 2-axis sensors $14c/14d/14e$ having four plates $15c/15d/15e$ to $18c/18d/18e$ arranged symmetrically about a central plate $19c/19d/19e$. FIG. 1F shows a preferred configuration.

The sensor matrix 10, 14 is conveniently formed by normal printed circuit techniques. Since a human finger-tip makes a near-circular contact of about 1 cm diameter, the central electrode 13, 19 is preferably made circular and about the same size, anything larger calling for an undue movement before any response is achieved, and anything smaller reducing the available output of the device.

In the preferred arrangement of FIG. 1F the four outer electrodes 15 to 18 form equal segments equally spaced from the centre electrode 19, the space being approximately equal to the thickness of the insulating substrate which separates the finger from the electrodes, greater spacing reducing the effective capacitance and therefore the available signal, and less spacing reducing the amount of capacitance which can be intercepted by the finger.

The single connection 20 from the sensor central electrode 19 and the amplifier (or the drive), to be described inevitably runs close to the connection leads to two of the outer electrodes. To neutralise, or at least substantially reduce the resultant unbalance of the sensor, the central electrode has a dummy lead 20' extending diametrically opposite to the amplifier lead 20, and of sufficient length to provide a counterbalancing stray capacitance to the other two outer electrodes. Connections to all electrodes are printed so as to present a stable and well defined stray capacitance to the amplifier leads.

Similar extensions to the central electrode are printed at right angles to the earlier pair in order to maintain the same response to finger movement in all four intermediate directions, NE,SE,SW,NW.

This lead balance is non-critical when the leads are remote from the amplifier input connection or when they are screened by intervening grounded area of the printed circuit board.

To give overall screening and to reduce the influence of hand movement remote from the sensor, the external side of the pcb is copper-clad, with holes positioned accurately over each sensor. The underside of the sensor can be either screened or stood-off from the case or external objects by a distance much greater than the pcb thickness, so as to avoid influence from the position of external objects. In either case no movement of objects immediately behind the sensor should be allowed, neither conductors nor di-electrics.

FIG. 2 shows in simplified outline a typical embodiment of a device 22 according to the invention. A double-sided printed-circuit board 24 forms the top of a shallow enclosure 26. The upper surface 24a of 24 is a ground-plane with circular apertures 24b, 24c in the copper which coincide with the location of two sensors 14, which are printed on the underside of the pcb. The underside also carries the circuitry to surface-mounted IC's 28. A nine-conductor cable 30 connects the output of the device 22 to a host computer (not shown). The overall size of the device 22 is typically 160 by 80 by 7 mm.

Figure 2B:
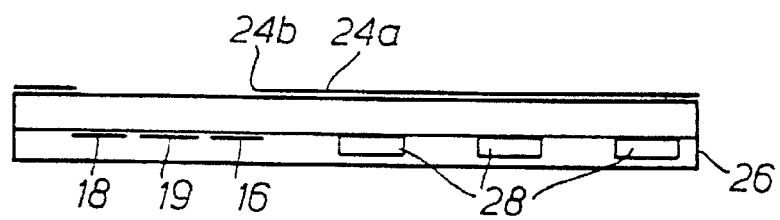
Figure 2C:
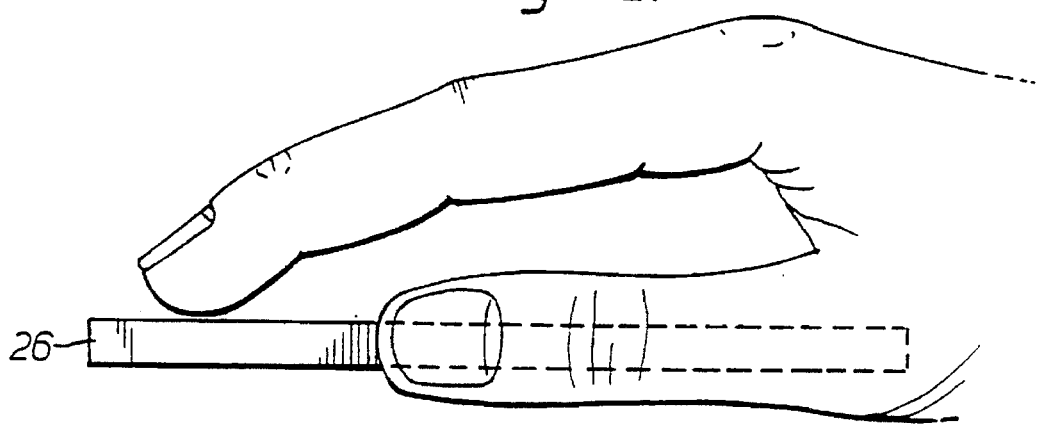
Figure 2D:
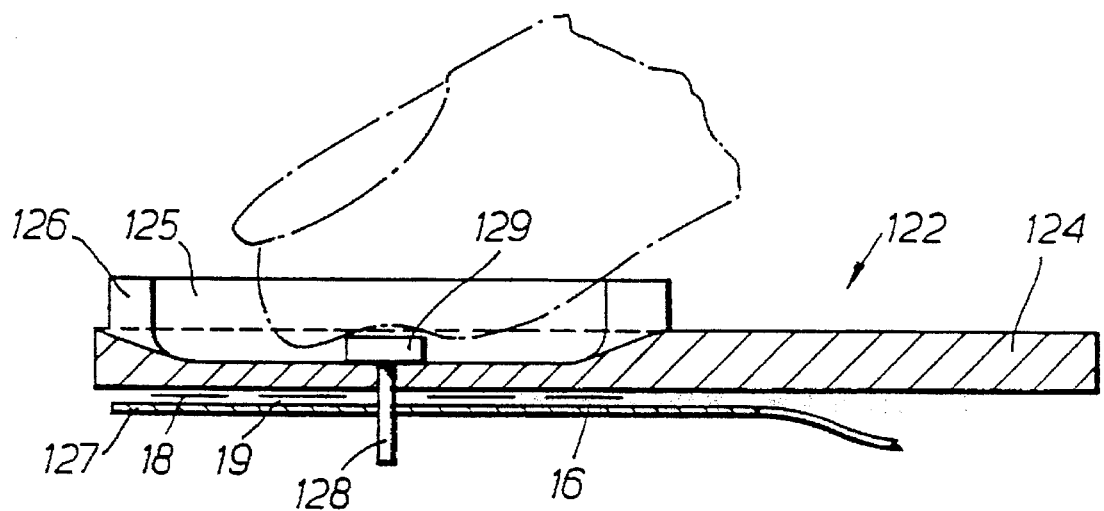
Figure 2E:
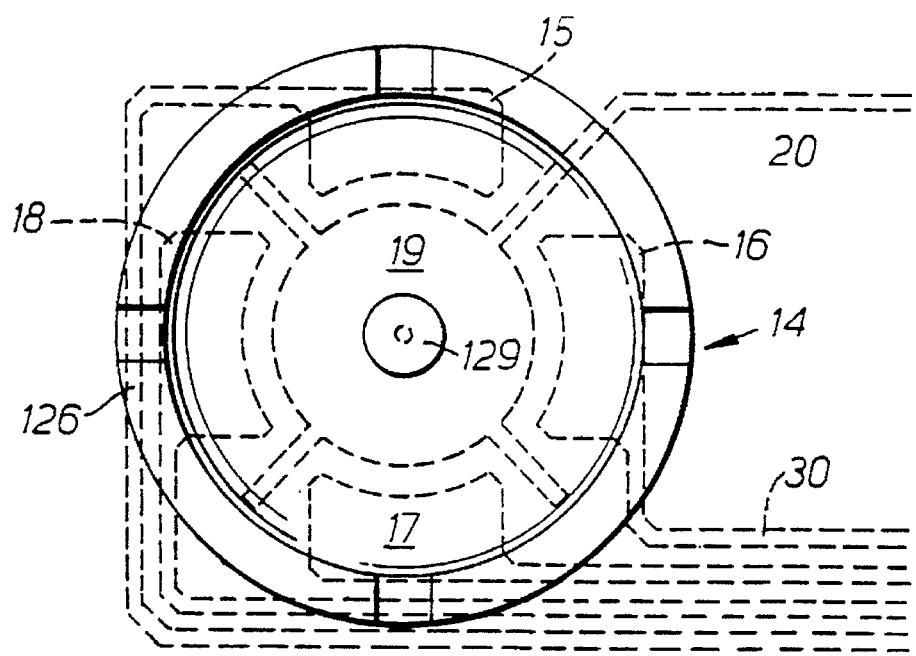

A modification of the device 22 shown in FIGS. 2A to 2C is shown in FIGS. 2D and E at 122. This device 122 comprises a panel 124 made from plastics or other suitable dielectric material about 1.5 mm thick. A circular depression 125 indicates the location of the active area of the sensor and a thicker rim 126 around the depression strengthening the panel in this area. A flexible printed circuit board (p.c.b.) 127 is mounted by means of a metal rivet 128 under the panel. The p.c.b. has formed on it four outer electrodes 15 to 18 equally spaced from a central electrode 19 as is shown in FIG. 2E. The head 129 of the rivet 128 and the rivet itself is insulated from the central electrode and acts instead of the upper surface 24 of the previous embodiment as a ground plane contact. The head 129 of the rivet not only acts as a ground contact but provides a sensor locating and retaining stud and a tactile point to assist the finger in finding the neutral point of the sensor.

The device 122 can be mounted directly to the inside face of a computer shell in suitable proximity to certain keys of the computer keyboard, one or more such keys being used as the fast/slow control and click-buttons in place of a second finger-sensor. The complete assembly of the device need be little larger than the sensor area itself which is little more than 25 mm square.

Figure 3A:
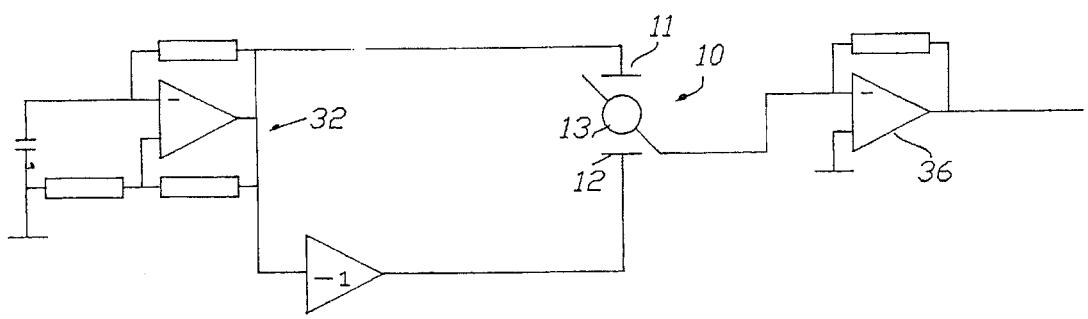
FIG. 3a shows a single-axis device with a balanced drive and an unbalanced detector.
Figure 3B:
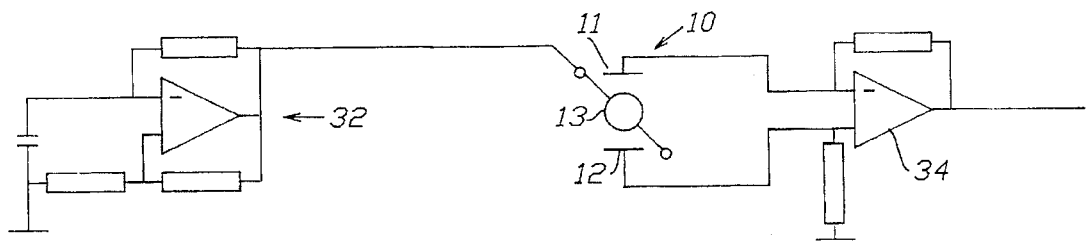
FIG. 3b shows a single axis device with the drive applied to the central plate and a balanced detector coupled to the other plates.

Balanced output can be achieved either by driving from a squarewave generator 32 the central electrode 13 or 19 and using a balanced-input amplifier 34 which will respond to the difference of the two outputs on outer electrodes 11, 12 as in FIG. 3b or preferably by driving the outer electrodes 11, 12 in balanced antiphase fashion and using an unbalanced amplifier 36 as in FIG. 3a, since the amplifier 36 now sees only the difference signal which being smaller is much easier to handle, and the generation of anti-phase signals is a trivial task, especially if squarewave signals are used.

Figure 3C:
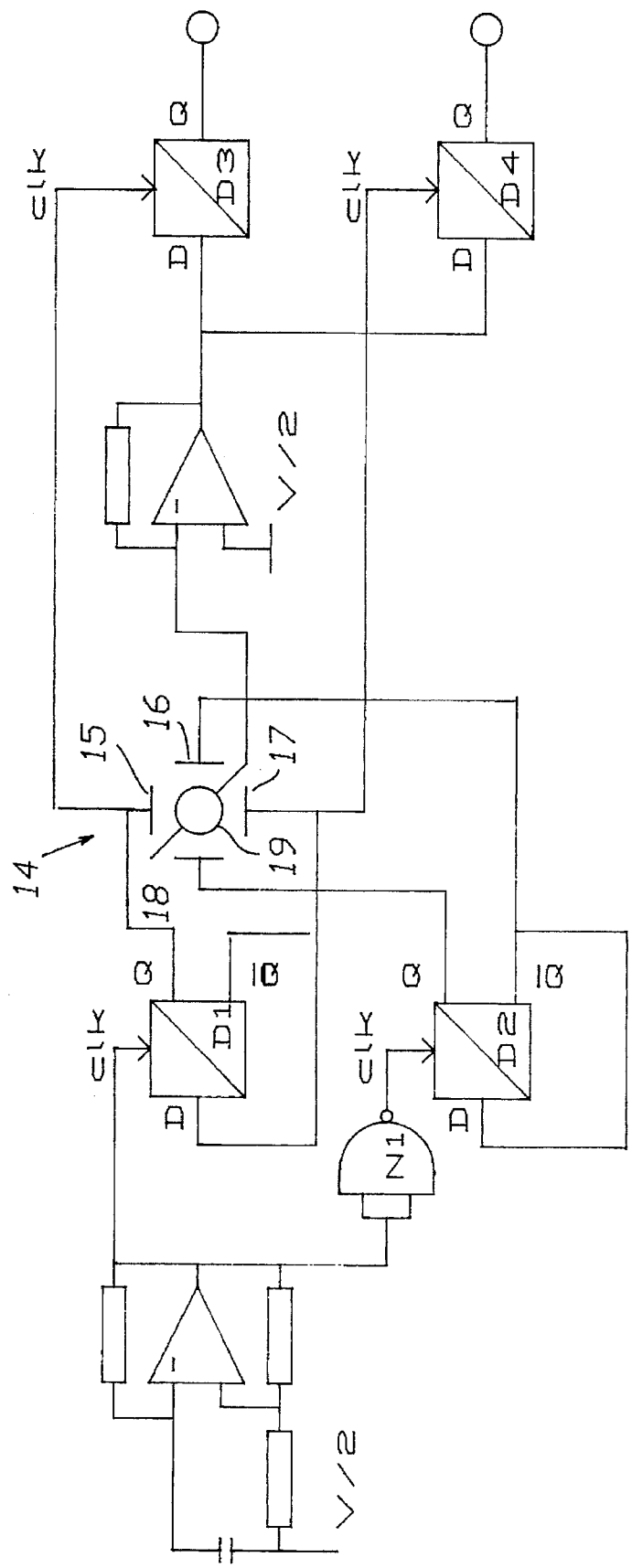
FIG. 3c shows a 2-axis sensor with a quadrature squarewave drive and phase sensitive detectors using D-registers.

In order to give full directional signals the two-axis arrangement of FIG. 3c can be used where the horizontal 16, 18 and vertical 15, 17 pairs of electrodes are driven in phase-quadrature by square-waves. Registers D1 and D2 provide balanced antiphase outputs at half the frequency of oscillator 32, the output of D2 being one half-period delayed on D1 by the action of inverter N1.

The separate contributions of vertical and horizontal output from the sensor 14 are resolved by registers D3 and D4 which act as phase-sensitive detectors, each being clocked in synchronism with the appropriate drive signal.

It is convenient but no essential to couple the central electrode 19 to the registers D3, D4 by way of an "operational amplifier" 36 with a low bandwidth such that it acts as an integrator. Since the drive signals are conveniently squarewaves, the imbalance signal will be composed of squarewaves, and the output of such an amplifier 36 will be a series of ramps, reaching maximum or minimum values at the end of each half-period of the squarewave.

These maxima will be synchronous with the clock pulse applied to the corresponding "phase-sensitive" D-register. Thus the register will latch and give a TRUE output at the Q terminal only if the ramp is sufficiently positive at the instant the clock terminal goes positive.

An important feature of this ramp output from the amplifier is that its level corresponds exactly with its mean level at the intermediate clock intervals, thus those registers clocked by quadrature signals will not respond, except to finger movement in an orthogonal direction. Movement in an intermediate direction will give an output from TWO registers.

The physical orthogonality of the sensor 14 is linked to the phase orthogonality of the sensors' quadrature drive signals and it is desirable that the latter be truly orthogonal, i.e., that they be exactly in phase quadrature. This is achieved if the clock generator has unity mark-space ratio, which itself can be achieved by running the clock at twice the desired output frequency then using a divide-by-two circuit as in FIG. 6.

In order to ensure that no response is provided by the device unless demanded, despite noise, drift, and offset errors, a "deadzone" should be built into the system, such that a finite displacement of the finger from its central, neutral position is necessary to cause a response. The deadzone may be dispensed with if the finger is in constant contact and the ultimate sensitivity is desired.

Figure 4:
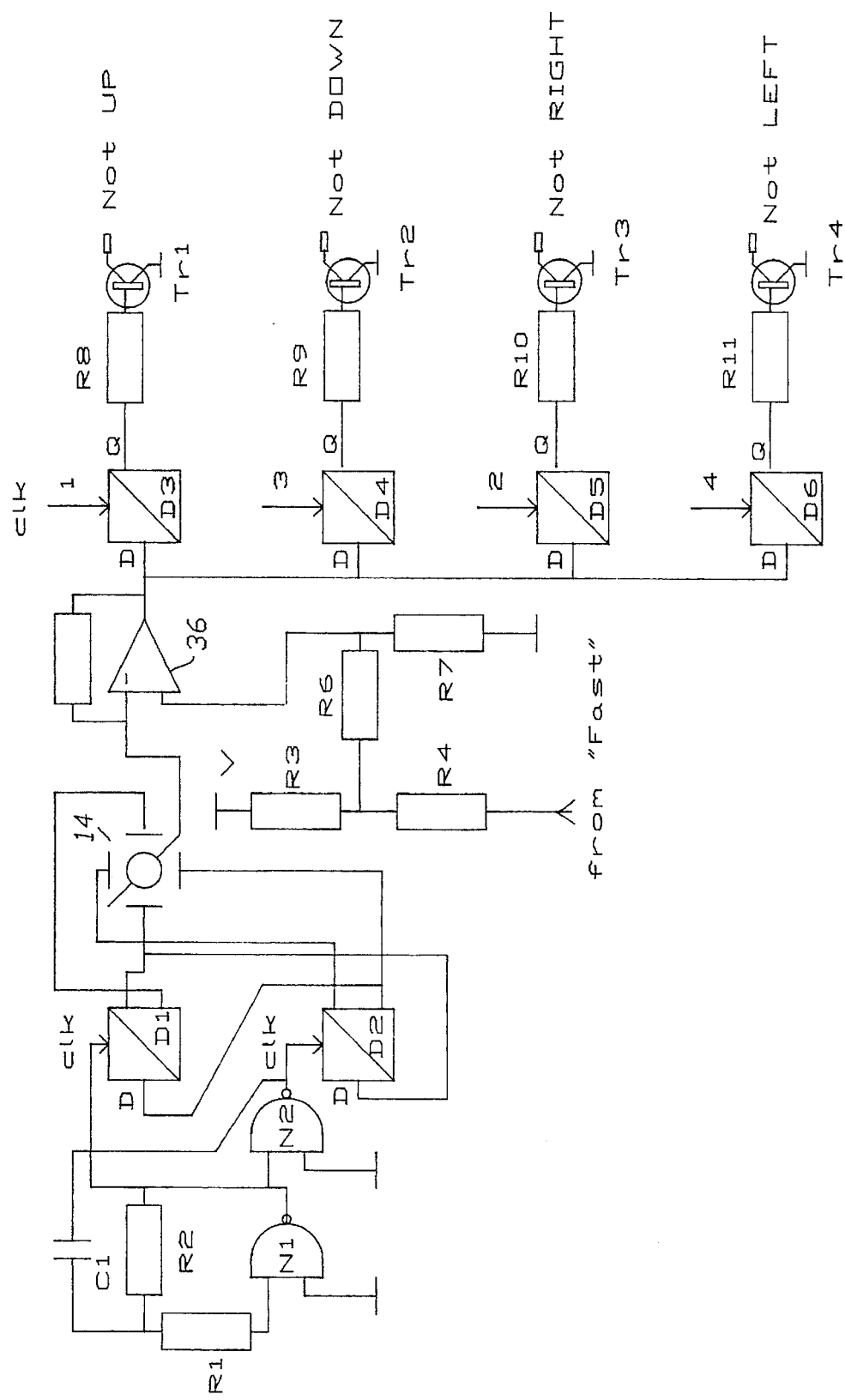
FIG. 4 shows a joystick emulator embodying a device according to the invention.

This deadzone is readily achieved by biasing the amplifiers to a level of say 0.25 volts lower than the threshold of the phase-sensitive detectors, 0.25 volts being about half the maximum output available from the sensor. See FIG. 4. The threshold of the CMOS D-registers which form the phase-sensitive detectors is typically Vd/2+/−5%, so the bias should be Vd/2−5%−0.25 v. This is achieved by resistor chain R3,R6,R7. Reduction of the deadzone can be controlled by a second sensor (not shown), one of whose phase-sensitive detector outputs is applied to the R4 terminal labelled "Fast".

Figure 6:
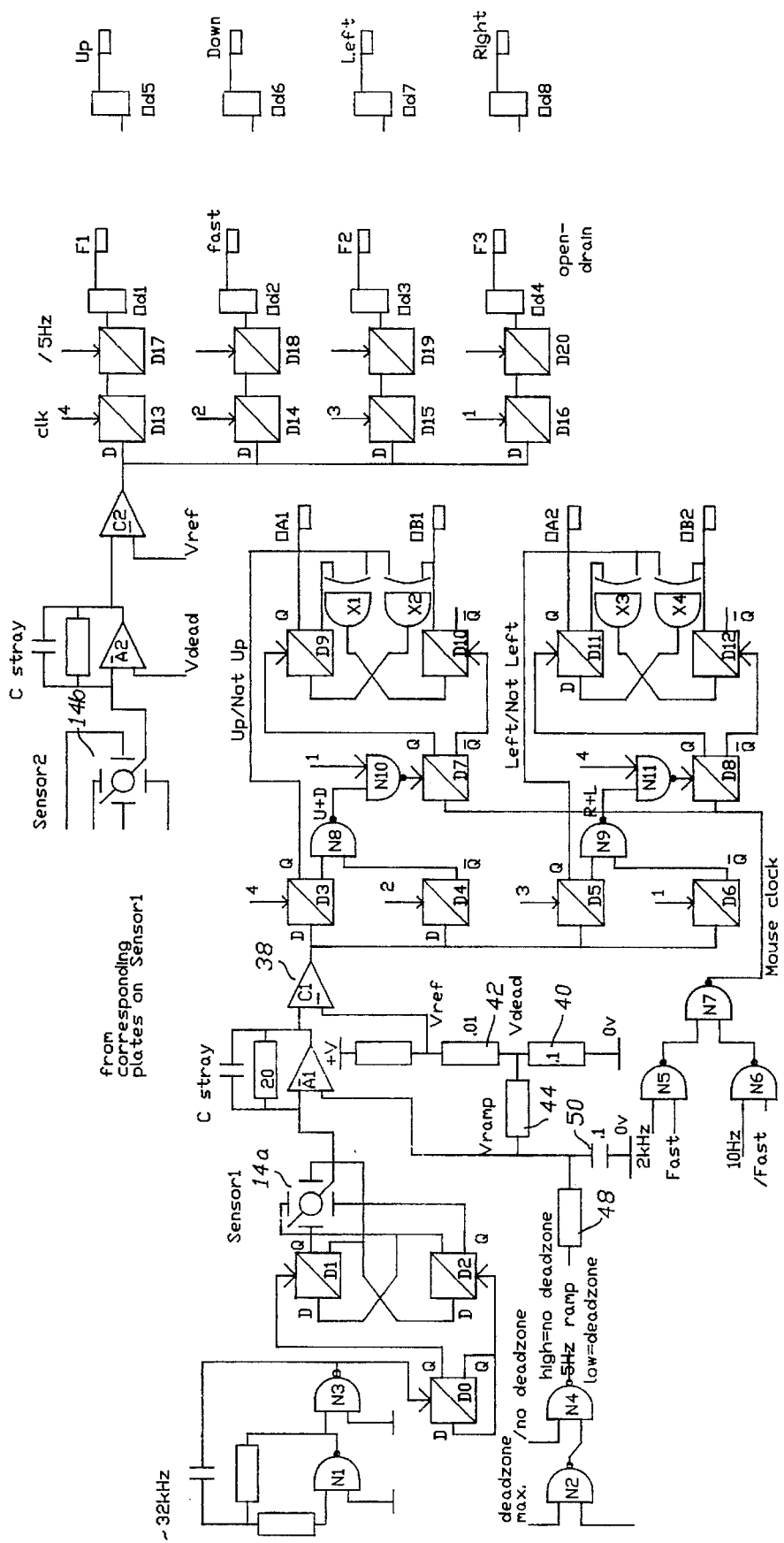
FIG. 6 shows a combined Joystick/Mouse emulator embodying a device according to the invention.

Referring to FIG. 6, if a comparator 38 is interposed between the amplifier A1 and phase-sensitive detector D3 to D6 then the +/−5% uncertainty is diminished by the effective voltage gain of the comparator and may be ignored. In this case a series string of three resistors, 40, 42, 44 of say 0.1 megohm, 0.01 megohm, 0.1 megohm will provide two voltages, one at V/2−V/42 for the comparator and the other at V/2−V/42 for the amplifier. The amplifier is configured to give unity gain at DC so the other comparator input will be at this same voltage and the effective bias will be equal to 2 V/42=0.24 volts approximately.

Whereas a significant deadzone as previously described may be desirable for the "button" outputs, the directional outputs should preferably give a linear response. This can be achieved by superimposing on the deadzone bias an alternating signal such as random noise or preferably a ramp of peak amplitude just less than the deadzone voltage. A suitable ramp can be derived from a squarewave as in FIG.

5 or FIG. 6 where the output from a suitable squarewave source 46 is converted to a ramp by a series resistor 48 and shunt capacitor 50.

Those outputs which are equivalent to "button-presses" should have a minimum output pulse-width to simulate a mechanical switch with backlash. This may be achieved by using the normal phase-sensitive detector output to operate a latch which can only change after a defined interval. FIG. 6 shows such a way, where D17-20 are clocked at a slow speed and will follow the phase-sensitive detector outputs only if the latter are sustained for a finite time, and will hold that output for at least 1 period of the slow clock.

Figure 5:
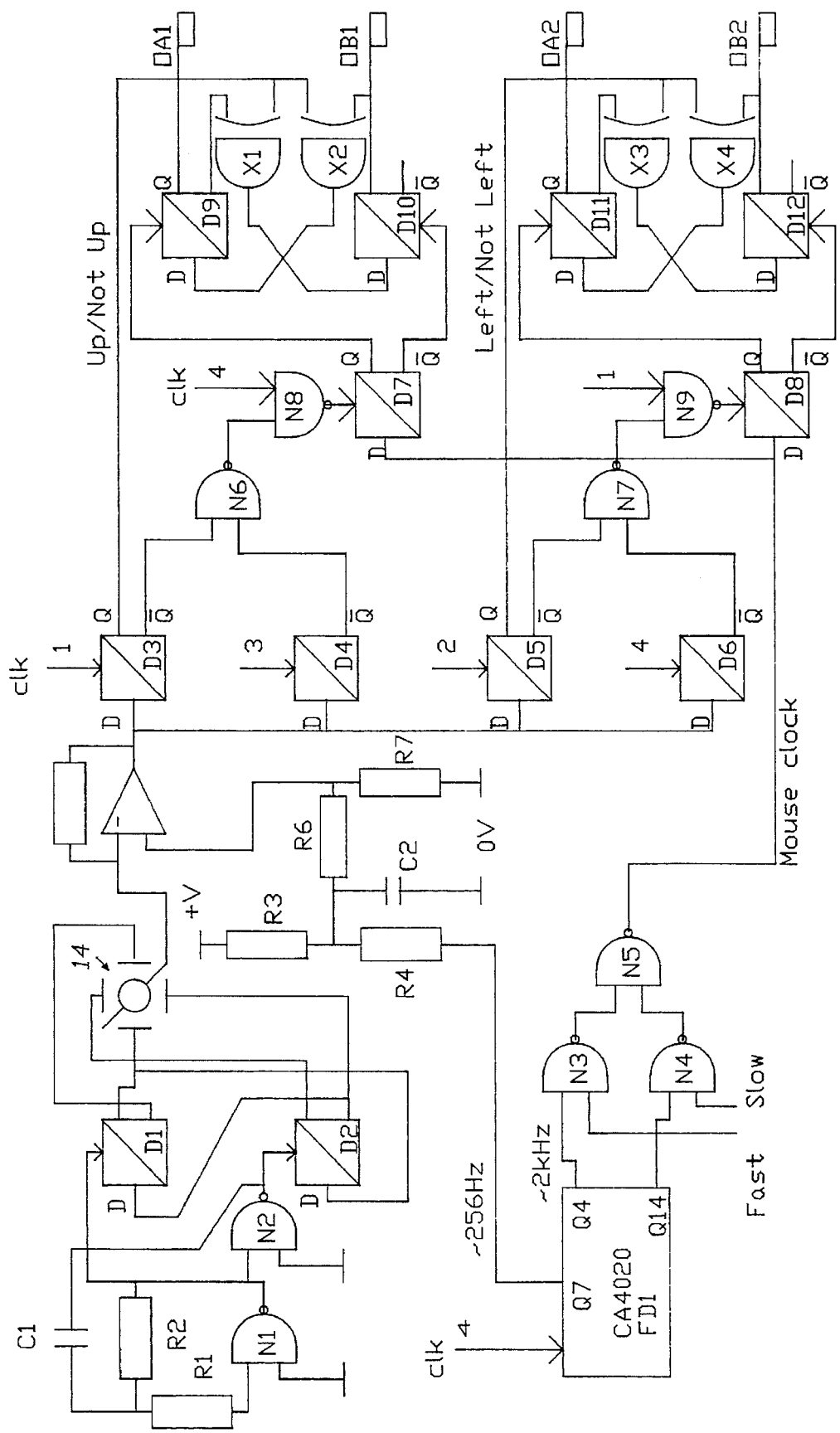
FIG. 5 shows a Quadrature-Mouse emulator embodying a device according to the invention.

In order to properly emulate a quadrature mouse, the directional output should produce two sequences of pulses in phase-quadrature, for each direction of movement left-right and up-down. These can be produced as shown in FIG. 5 where registers D9, D10 form a quadrature generator producing squarewave outputs at OA1, OB1 which are in phase quadrature, the leading output being determined by the Up/not Up control input to Exclusive-OR gates X1,X2 which reverse the sense of feedback to the two registers. The maximum possible rate of change of the output squarewaves is determined by the pulse rate of the "mouse clock" applied to D7 which is selected from the outputs available from the frequency divider FD1 by the action of gates N3,4,5 under the control of the output from the F4 button, not shown. The actual transitions of the output squarewaves at OA1 and OB1 are regulated by the NOT outputs of the UP or DOWN registers D3, D4 via gates N6, N8. Left/Right quadrature signals at OA2, OB2 are generated in similar fashion.

In the following description of FIG. 6 the following devices may be used:

D-registers can be type CA4013 from RCA and others, NAND gates can be ¼ of CA4011 from RCA and others, XOR gates can be ¼ of CA4070 from RCA and others.

All can be part of an ASIC from various sources, except perhaps the amplifiers which are preferably type TLC251 from Texas Instruments.

The following terms are used:

Joystick: a device resembling the control column of an early aircraft, which has four switch contacts the appropriate one of which is closed while the stick is held forward, backward, left, right. It may also have switches which are closed by "Fire" buttons mounted on the stick or on its base.

Mouse: a device which is pushed across a surface to give signals according to the direction of motion. The Mouse usually also contains button-operated switches and may produce signals similar to those of a Joystick. Some sophisticated Mouses are also capable of emulating any of the following:

Quadrature Mouse: a mouse which generates two sets of signals, one for each direction of movement forward/backward and left/right, each set comprising pulses on two separate lines, these pulses being in phase-quadrature. Distance moved is indicated by the number of pulses or by the number of transitions of the quadrature signals, and direction by the relative phase of the signals.

Serial Mouse: a Mouse whose signals are transmitted to the computer via an RS232 or other serial link.

Bus Mouse: a Mouse whose signals are transmitted in parallel-data fashion over more than one line, usually to a special hardware decoding device within the computer.

Open Drain: a CMOS logic element whose output terminal shows either a low resistance to ground, Logic True= active low, or is virtually open-circuit. Logic False=off or floating. Equivalent to a TTL open collector element.

ASIC: Application-specific Integrated Circuit.
UART: Universal Asynchronous Receiver and Transmitter.

N1, N3 form an oscillar of approximately 32 kHz frequency which drives a divide-by-two circuit 52 formed by register D0 whose antiphase outputs drive registers D1, D2 which form a quadrature-phase generator which drives the two finger-sensors 14a, 14b.

The output from sensor 14b is amplified and integrated by integrating operational amplifier A2 which drives a comparator C2 which drives the Data input terminals of the four registers D13-D16 which act as phase-sensitive detectors. The second input of the comparator C2 is at the Vref potential which is Vdeadzone higher than the output of the amplifier, so that only signals greater than Vdeadzone will produce an output.

Each detector output is captured and held by the following register set D17-D20 which are clocked at a slow speed, perhaps 5 Hz, thus producing long pulses which simulate a mechanical switch without contact bounce. These outputs drive the "open-drain" output elements Od1-Od4 thus giving effective "contact-closure-to-ground". These simulate the Fire-button outputs of a Joystick, or the Click buttons of a Mouse.

Sensor 14a similarly drives four phase-sensitive detectors D3-D6 via an amplifier A1 and comparator 38 but now the deadzone is filled by the ramp-signal generated by a 5 Hz squarewave and the action of the 10 Megohm resistor 48 and 0.1 microfarad capacitor 50 at the non-inverting input of A1. The 5 Hz signal driving this network can be turned off high or off low by additional logic or by initialisation signals in order to give either zero deadzone, maximum deadzone, or linearising ramp.

For Joystick emulation the outputs of the phase-sensitive detectors D3-D6 are applied to the "open drain" elements Od5-Od8 via multiplexing logic not shown. For Quadrature Mouse emulation the detector, NotQ outputs of D3,D4 are used to gate clock pulses into D7 which receives the slower "mouse clock" pulses as Data input. The slowly-changing outputs of D7 drive the quadrature generator formed by D9,D10 whose phase sequence is controlled by the Up/Not Up signal into Exclusive-OR gates X1,X2 which act to reverse the sense of feedback in the D9,D10 quadrature generator. The quadrature squarewaves are output at terminals OA1,OB1 representing vertical motion. Quadrature generator registers D11,D12 are similarly controlled, outputting squarewaves to terminals OA2, OB2 representing horizontal motion.

A change-over from Joystick to Mouse emulation can be effected by additional logic (not shown), the detailed means of achieving this being governed by the pre-setting capabilities of any ASIC into which the design may be incorporated.

Bus Mouse emulation can be achieved by outputting the pulses from D7 and D8 into 8 bit counters whose outputs are multiplexed onto an 8 bit bus in known fashion.

Serial Mouse emulation can be achieved by multiplexing the output of such counters via a UART and RS232 IC in known fashion.

The output from D14 can be used to control via gates N5, N6, N7 the selection of pulse-rate applied to D7 and D8 which sets the effective speed of movement of the Mouse emulation. The same output can be used to control the magnitude of deadzone in the Joystick emulation by gating the 5 Hz ramp signal as already described.

The comparators are incorporated because of uncertainty of operation of the D-registers which may be part of an ASIC and not elements which can be separately tested and adjusted.

I claim:

1. A finger operable control device comprising a sensor having a central electrically conductive plate, a first pair of electrically conductive plates on a first axis and spaced from opposite edges of the central plate to form a first pair of capacitors therewith having substantially equal capacitance, a second pair of electrically conductive plates on a second axis different from the first axis and spaced from opposite edges of the central plate to form a second pair of capacitors therewith having substantially equal capacitance, characterised in that opposite members of each pair of plates are driven by antiphase outputs of a quadrature-phase generator and the central plate is connected to a detector capable of sensing the magnitude and/or phase of the signal therefrom caused by capacitive imbalance induced by presence of either a finger or a finger-operable earthed object placed on or near the conductive plates when the finger or object is displaced laterally from the intersection of the two axes.

2. A device as claimed in claim 1 wherein the generator includes an oscillator operative at a frequency of twice the frequency of the quadrature phase signals.

3. A device as claimed in claim 1 wherein the detector is preceded by an amplifier.

4. A device as claimed in claim 3 wherein a dead-zone is provided by appropriately biassing the amplifier.

5. A device as claimed in claim 3 wherein a dead-zone is provided by connecting the output of the amplifier to a comparator, the second input of the comparator being connected to a reference signal to provide the dead-zone.

6. A device as claimed in claim 1 wherein the detector circuit comprises at least one phase sensitive detector having reference input coupled to an output of the first quadrature phase generator.

7. A device as claimed in claim 6 wherein the output of the phase sensitive detector is coupled to an input of a second quadrature phase generator.

8. A device as claimed in claim 7 wherein a clock pulsing means is coupled between said phase sensitive detector and said second generator.

9. A device as claimed in claim 6, wherein said phase sensitive detector produces at its output a signal indicating displacement of the finger or object relative to at least the first axis.

10. A device as claimed in claim 4 or 5 wherein the amplifier is biassed to a level lower than the threshold of the phase sensitive detectors, and wherein a ramp is applied to the amplifier bias whereby the dead-zone is at least partially eliminated.

11. A device as claimed in claim 4 or claim 5 wherein a random noise signal is applied to the amplifier whereby the dead-zone is at least partially eliminated.

12. A device as claimed in claim 1 wherein an electrical lead extends from the central plate between a plate of the first pair and a plate of the second pair, and a dummy lead extends between the other plates of the first and second pairs.

13. A device claimed in claim 1 comprising at least two said sensors.

14. A mouse emulator comprising a finger operable device as claimed in claim 1.

15. A joystick emulator comprising a finger operable device as claimed in claim 1.

* * * * *